(12) United States Patent
Menard

(10) Patent No.: US 9,231,092 B2
(45) Date of Patent: Jan. 5, 2016

(54) BI-DIRECTIONAL SWITCH WITH Q1 AND Q4 CONTROL

(75) Inventor: Samuel Menard, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 40 days.

(21) Appl. No.: 13/643,967

(22) PCT Filed: Apr. 22, 2011

(86) PCT No.: PCT/FR2011/050935
§ 371 (c)(1),
(2), (4) Date: Nov. 12, 2012

(87) PCT Pub. No.: WO2011/135242
PCT Pub. Date: Nov. 3, 2011

(65) Prior Publication Data
US 2013/0049065 A1    Feb. 28, 2013

(30) Foreign Application Priority Data

Apr. 29, 2010  (FR) ...................................... 10 53326

(51) Int. Cl.
*H01L 29/747*    (2006.01)
(52) U.S. Cl.
CPC .................................... *H01L 29/747* (2013.01)
(58) Field of Classification Search
CPC .................................................. H01L 29/0619
USPC .................................................... 257/E29.215
See application file for complete search history.

(56) References Cited

U.S. PATENT DOCUMENTS

| | | | |
|---|---|---|---|
| 5,914,502 | A | 6/1999 | Simmonet |
| 6,034,381 | A | 3/2000 | Pezzani |
| 6,593,600 | B1 | 7/2003 | Duclos et al. |
| 6,927,427 | B2 | 8/2005 | Ladiray |
| 2003/0001169 | A1 | 1/2003 | Simmonet |
| 2004/0021148 | A1* | 2/2004 | Simonnet ...................... 257/107 |
| 2004/0026711 | A1* | 2/2004 | Gimonet et al. ............. 257/119 |

OTHER PUBLICATIONS

International Search Report dated Aug. 22, 2011 from corresponding International Application No. PCT/FR2011/050935.
Sanchez, J.L., et al., *Realization of Vertical P<+> Walls Through-Wafer for Bi-Directional Current and Voltage Power Integrated Devices*, 2003 IEEE 15th InternationalSymposium on Power Semiconductor Devices and IC'S Proceedings, Cambridge, UIK, Apr. 14-17, 2003, New York, NY; pp. 195-198 XP010653757.
English Translation of the Written Opinion of the International Searching Authority dated Nov. 20, 2010 from corresponding International Application No. PCT/FR2011/050935.

* cited by examiner

*Primary Examiner* — Lynne Gurley
*Assistant Examiner* — Vernon P Webb
(74) *Attorney, Agent, or Firm* — Allen, Dyer, Doppelt, Milbrath & Gilchrist, P.A.

(57) ABSTRACT

A vertical bidirectional switch of the type having its control referenced to the rear surface, including on its rear surface a first main electrode and on its front surface a second main electrode and a gate electrode, this switch being controllable by a positive voltage between its gate and its first electrode, wherein the gate electrode is arranged on the front surface of a via crossing the chip in which the switch is formed.

21 Claims, 3 Drawing Sheets

BI-DIRECTIONAL SWITCH WITH Q1 AND Q4 CONTROL

CROSS REFERENCE TO RELATED APPLICATIONS

This application is a U.S. National Stage patent application based on International patent application number PCT/FR2011/050935, filed on Apr. 22, 2011, which application claims the priority benefit of French patent application number 10/53326, filed on Apr. 29, 2010, which applications are hereby incorporated by reference to the maximum extent allowable by law.

BACKGROUND

1. Technical Field

The present disclosure relates to a bidirectional switch formed of a semiconductor chip comprising a main electrode on each surface of the chip and a control electrode on the front surface of the chip, this control electrode or gate being controlled by a voltage referenced to the voltage of the rear surface electrode.

2. Discussion of the Related Art

Such components are different from unidirectional thyristors and from bidirectional triacs in which the gate signal is controlled by reference to the front surface electrode. Having the gate electrode referenced to the rear surface is advantageous in that it is convenient to connect the rear surface comprising a single electrode to a ground plate or a radiator, which enables the gate signal to be referenced to a fixed voltage, for example, the ground, while in many applications, the main front surface electrode is connected to the mains voltage, which make it necessary to provide isolation systems to deliver a voltage between a control signal and a variable potential.

The applicant, which has created the concept of bidirectional switch referenced to the rear surface, sold under trade name "ACS", has conducted many studies on these components. U.S. Pat. Nos. 6,034,381, 6,593,600, and 6,927,427 will especially be mentioned. Further, previously, the applicant had provided to connect multiple unidirectional components (thyristors) in parallel with a common cathode, the gates being referenced to the cathode, as described in U.S. Pat. No. 5,914,502.

The various known architectures of bidirectional rear surface referenced switches, when controllable in Q1 and Q4 modes, that is, when the gate is positive with respect to the rear surface electrode, have the disadvantage of involving a transistor or a lateral thyristor for their turning-on. This sets, on the one hand, an issue in terms of surface area assigned to the gate, and on the other hand, possible latch-up problems when an abrupt voltage variation is applied between the main electrodes (dV/dt turn-on).

SUMMARY

It is thus desired to form a bidirectional switch in which the gate electrode is referenced to the rear surface, having a particularly simple and low-bulk control structure, and which is less sensitive to latch-ups due to abrupt voltage variations between its main electrodes.

An embodiment provides a vertical bidirectional switch of the type having its control referenced to the rear surface, comprising, on its rear surface, a first main electrode and on its front surface a second main electrode and a gate electrode, this switch being controllable by a positive voltage between its gate and its first electrode, wherein the gate electrode is arranged on the front surface of a via crossing the chip in which the switch is formed.

According to an embodiment, the bidirectional switch comprises a semiconductor substrate of a first conductivity type surrounded with a wall of the second conductivity type, on the front surface side, a well of the second conductivity type in substantially half of which is formed a first region of the first conductivity type, a via of the second conductivity type running from the front surface to the rear surface of the substrate, arranged between the first region and the wall, this via being in contact with the gate electrode, on the rear surface side, a layer of the second conductivity type in which is formed a second region of the first conductivity type substantially in front of the portion of the well which is not taken up by the first region, an insulating layer being arranged on the rear surface, around the via region. The layer of the second conductivity type is interrupted and said insulating layer is arranged so that, when a positive voltage is applied between the gate electrode and the first main electrode, a current flows in said layer of the second conductivity type under the substrate.

According to an embodiment, a third region of the first conductivity type is formed on the rear surface side so that said current flows in a pinched region.

According to an embodiment, the bidirectional switch further comprises a fourth region of the first conductivity type arranged in the well on the front surface side and connected to the gate electrode, whereby the switch is controllable in all four quadrants.

According to an embodiment, the first conductivity type is type N.

The foregoing and other objects, features, and advantages will be discussed in detail in the following non-limiting description of specific embodiments in connection with the accompanying drawings.

DETAILED DESCRIPTION

As usual in the representation of semiconductor components, the various drawings are not to scale.

Figure 1A:
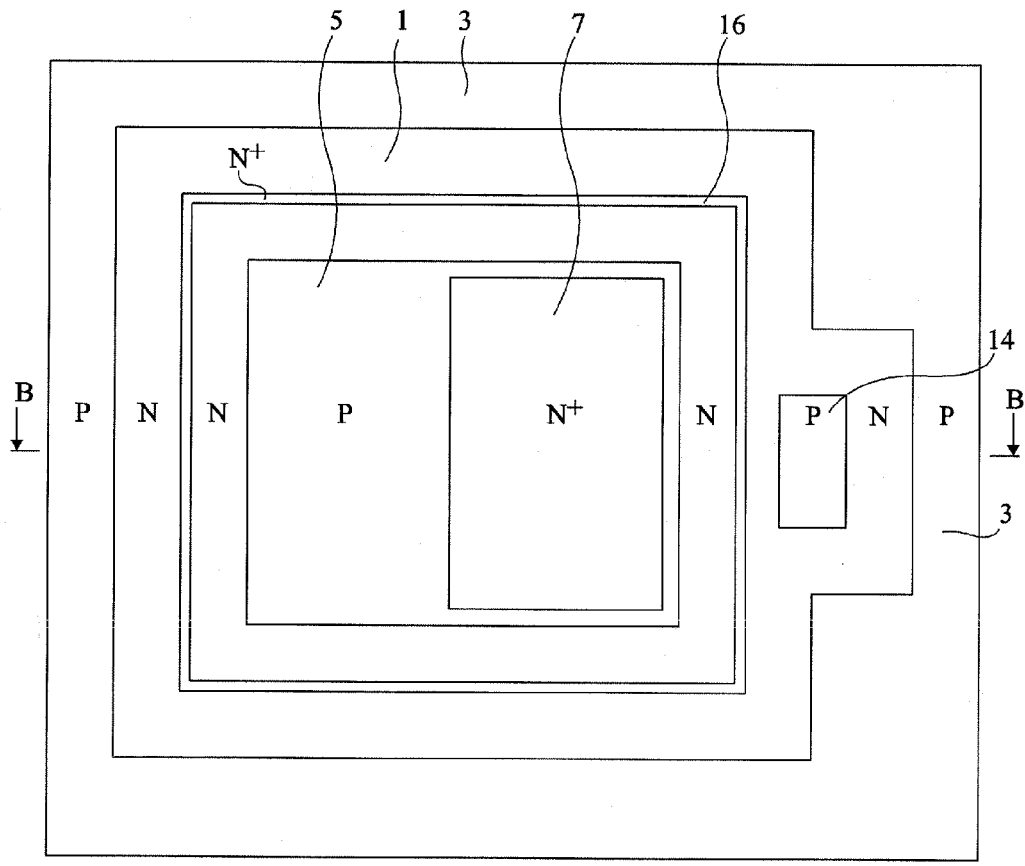
FIG. 1A is a simplified top view of a bidirectional switch according to an embodiment.
Figure 1B:
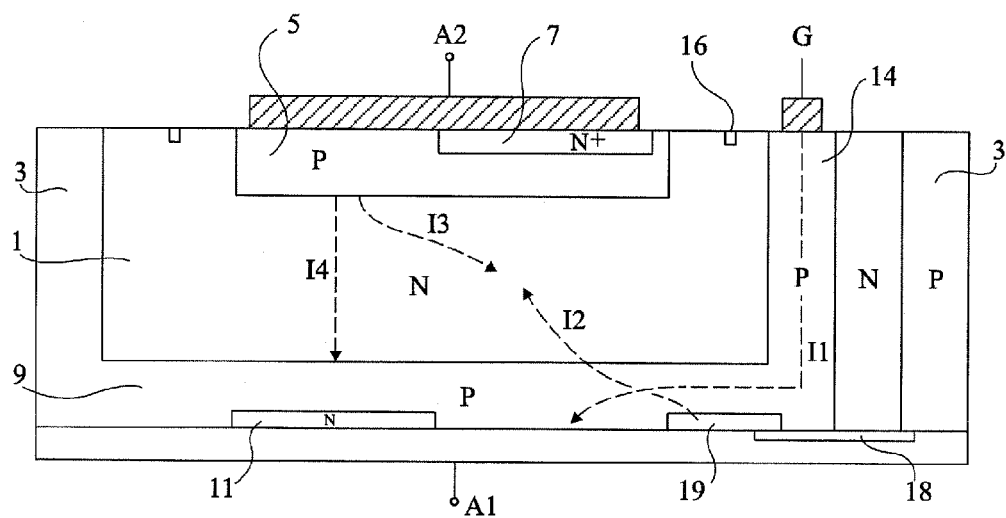
FIG. 1B is a simplified cross-section view along line B-B of FIG. 1A and is further intended to illustrate the operation in quadrant Q1.

As shown in the top view of FIG. 1A and the cross-section view of FIG. 1B, a bidirectional switch is formed from a lightly-doped N-type substrate 1 surrounded with a P-type peripheral wall 3. Of course, during the manufacturing, substrate 1 corresponds to a chip of a silicon wafer.

A P-type well 5 extends in a substantially central position on the upper surface (or front surface) side of substrate 1. A heavily-doped N-type region 7 (N$^+$) is formed in substantially half of well 5. The lower surface (or area surface) of the substrate is mainly taken up by a P-type layer 9 having limits which will be discussed hereafter in relation with the discussion of the switch operation. A heavily-doped N-type region 11 is formed in layer 9 facing the portion of P well 5 in which region 7 is not formed. Thus, the power portion of the component comprises two thyristors in antiparallel respectively comprising regions and layers 5-1-9-11 and 7-5-1-9.

A P-type via 14 crosses substrate 1 to reach P-type layer 9. This via is arranged in substrate 1 in front of one side of N region 7 and may, for example, correspond to a drive-in region. Further, an $N^+$-type ring 16 surrounding P well 5 and forming a channel stop region may be provided. On the lower surface side, an insulating layer 18 extends under the portion of N region 1 arranged between via 14 and peripheral well 3 and extends towards the center of the component. Further, a heavily-doped N-type region 19 is arranged in layer 9 on the lower surface side substantially between the emerging portion of via 14 and the projection of $N^+$-type region 7.

A main electrode metallization A1 covers the entire lower surface. A main electrode metallization A2 covers all the regions of P well 5 and of $N^+$ region 7 and a gate metallization G covers the upper surface of via 14. For simplification, these metallizations are not shown in FIG. 1A and only appear in FIG. 1B. Further, in FIG. 1B, the insulating layers which cover the front surface outside of the areas of contact with the metallizations have not been shown.

For bidirectional switches, four turn-on quadrants are defined. It is still assumed that electrode A1 is grounded. First quadrant Q1 corresponds to a positive A2 and a positive G, second quadrant Q2 corresponds to a positive A2 and a negative G, third quadrant Q3 corresponds to a negative A2 and to a negative G, and fourth conduction quadrant Q4 corresponds to a negative A2 and a negative G. The previously-described component is capable of operating in the first and fourth quadrants, the component being capable of being turned on by application to the gate electrode of a positive signal with respect to electrode A1, whatever the biasing of electrode A2.

In FIG. 1B, the turn-on mode in quadrant Q1, that is, when electrode A2 is positive with respect to electrode A1, has been indicated by arrows in dotted lines. The positive gate terminal with respect to electrode A1 causes the flowing of a current I1 from electrode G to electrode A1, which runs vertically through via 14, then horizontally (leftwards in the drawing) in a portion of P layer 9 between N substrate 1 above insulating layer 18 and N region 19, if present. The current cannot directly flow towards peripheral wall 3 due to the fact that P layer 9 does not extend under the portion of substrate 1 located outside of the emerging portion of via 14. The flowing of a current in the pinched region of P-type layer 9 between insulating layer 18 and region 19 and substrate 1 makes the junction between P layer 9 and region 19 conductive and electrons are injected into the substrate along arrow 12. This results in a hole injection through P well 5 into the substrate (arrow 13) to ensure the balance and the conduction starts in the vertical thyristor comprising layers and regions 5-1-9-11, as indicated by arrow 14.

It should be noted that this turning-on does not correspond to the turning-on of a transistor or of a lateral thyristor and no turning-on can occur due to a fast overvoltage between electrodes A2 and A1. The component, in this embodiment, is thus particularly insensitive to the parasitic dV/dt turn-on.

Figure 1C:
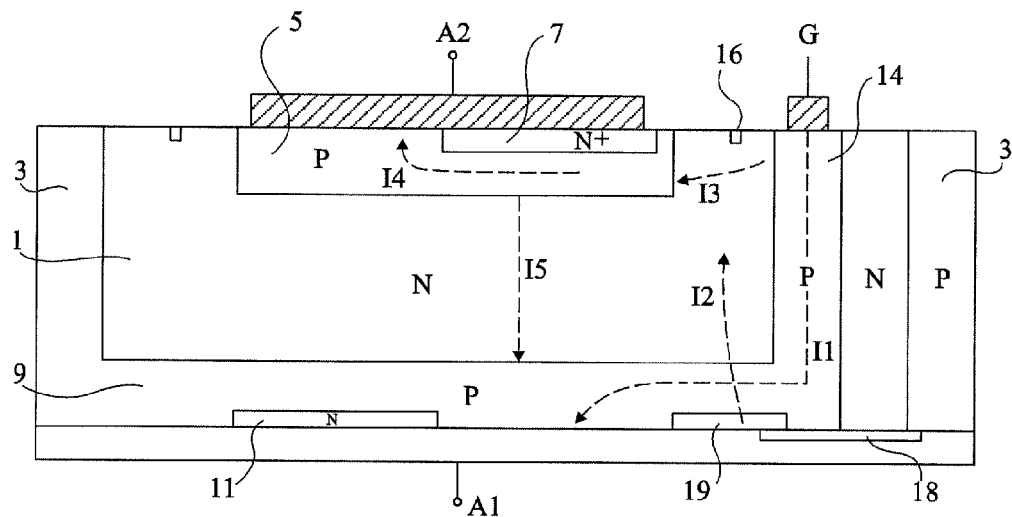
FIG. 1C is a cross-section view similar to that of FIG. 1B intended to illustrate the operation in quadrant Q4.

FIG. 1C illustrates the turning-on in mode Q4, that is, when electrode A2 is negative with respect to electrode A1. Initially, the same current I1 as indicated previously flows through via 14. Similarly, this causes an injection of electrons 12 into the substrate. The PN junction between via 14 and substrate 1 which tends to become conductive causes the injection of holes from region 14 to P well 5 (arrow I3). These holes direct towards negative electrode A2 in P region 5 (arrow I4) and this, conventionally, unlocks vertical thyristor 7-5-1-9 (arrow I5).

Figure 2:
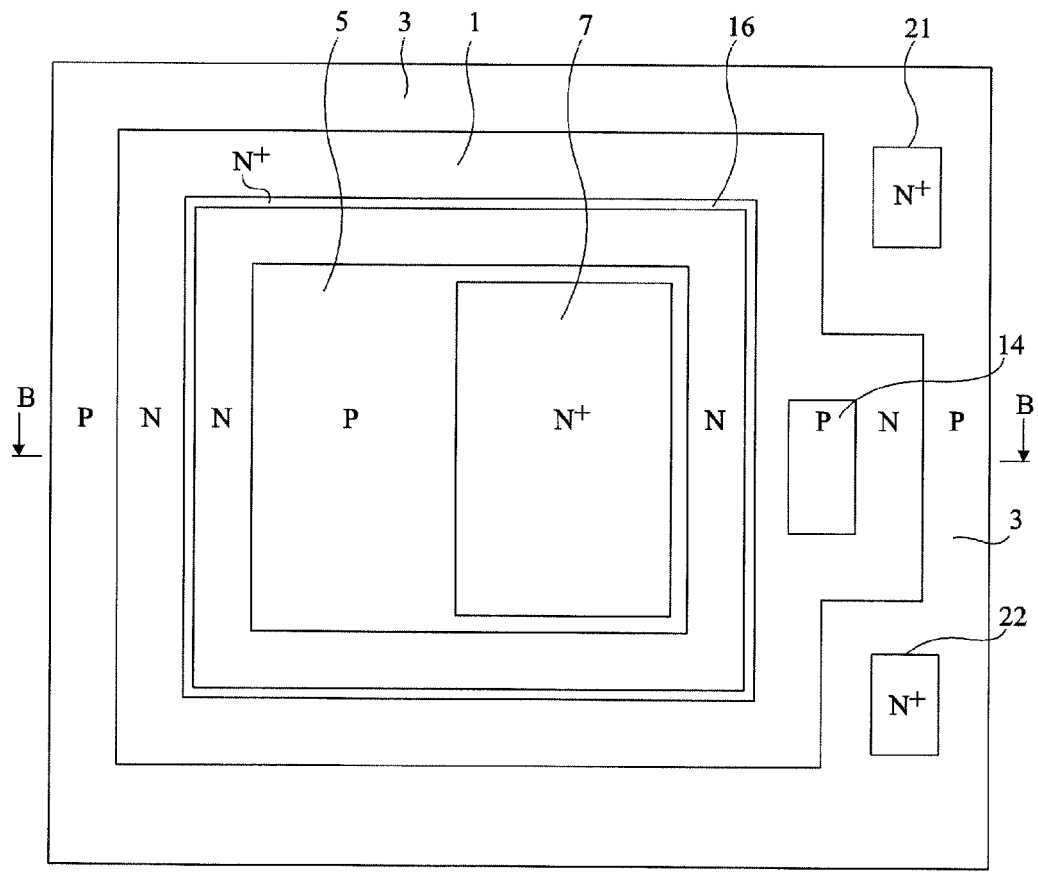
FIG. 2 is a top view of an alternative embodiment in which the bidirectional switch is likely to be controlled in quadrants Q2 and Q3 in addition to quadrants Q1 and Q4.

FIG. 2 shows a variation of the embodiment of FIG. 1. In addition to the elements already shown and described in relation with FIG. 1, two $N^+$ regions 21, 22 (a single one would actually be necessary) formed in the upper portion of peripheral insulating wall 3 are present. These $N^+$ regions may be connected by a metallization to gate via 14 and form gates that can turn on the bidirectional switch in quadrants Q2 and Q3, similarly to what is described in at least some of the US patents mentioned at the beginning of the present description. A switch controllable in the four quadrants is thus obtained.

Figure 3:
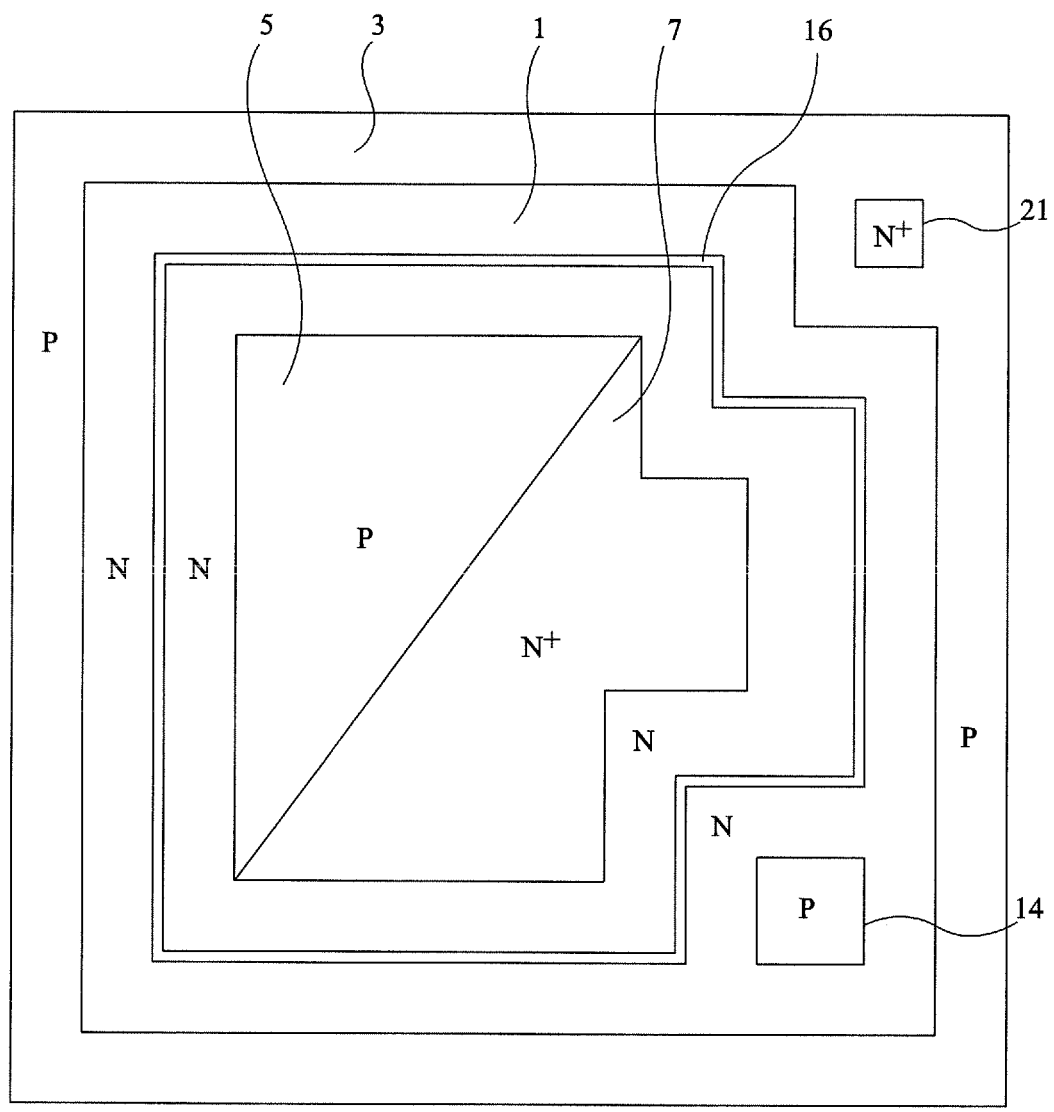
FIG. 3 is a top view illustrating an alternative topology of a component according to an embodiment.

FIG. 3 shows an alternative embodiment of the structure illustrated in top view in FIGS. 1 and 2. This variation only is a topological variation: gate via 14 is placed in a corner of the structure and gate 21 is placed in another corner of the structure, via 14 facing $N^+$ portion 7 which, this time, cuts P well 5 diagonally.

Of course, the present invention is likely to have many alternative embodiments which will readily occur to those skilled in the art, especially after reading of the previously-mentioned prior patents of the applicant which will be considered herein as known. Thus, no detailed example of doping levels, of layer thicknesses, and of dimensions has been given herein, these values being simple to determine by those skilled in the art.

Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A vertical bidirectional switch comprising:
a semiconductor substrate of a first conductivity type and having front and rear surfaces;
a plurality of P-N junctions in said semiconductor substrate and being between the front and rear surfaces, said plurality of P-N junctions defining first and second thyristors coupled in anti-parallel;
a control electrode on the front surface of the semiconductor substrate;
a first electrode on the rear surface of the semiconductor substrate;
a second electrode on the front surface of the semiconductor substrate;
a semiconductor column directly coupled to said control electrode and extending between said control electrode and said first electrode and coupled to at least one P-N junction from said plurality of P-N junctions, said semiconductor column having a same conductivity type throughout;
said control electrode configured to control a current flow between said first and second electrodes; and
a semiconductor wall in the semiconductor substrate and surrounding said semiconductor column, said semiconductor wall being of a second conductivity type different from the first conductivity type.

2. The vertical bidirectional switch of claim 1 further comprising:
a well of the second conductivity type formed in the front surface of said semiconductor substrate;
a first region of the first conductivity type in said well;

the semiconductor column being of the second conductivity type and being between said semiconductor wall and said first region;

a semiconductor layer of the second conductivity type and being on the rear surface side of the semiconductor substrate;

a second region of the first conductivity type in said semiconductor layer and aligned with a portion of the well not taken up by the first region; and an insulating layer being on the rear surface of said semiconductor substrate and adjacent the semiconductor column;

said semiconductor layer being interrupted, said insulating layer being arranged so that, when a positive voltage is applied between the control electrode and the first electrode, a current flows in said semiconductor layer under the semiconductor substrate.

3. The vertical bidirectional switch of claim 2 further comprising a third region of the first conductivity type on the rear surface so that said current flows in a pinched region.

4. The vertical bidirectional switch of claim 2, further comprising a fourth region of the first conductivity type arranged in the well on the front surface and coupled to the control electrode, whereby the vertical bidirectional switch is controllable in all four quadrants.

5. The vertical bidirectional switch of claim 2 wherein the first conductivity type is N-type.

6. An apparatus comprising:
a semiconductor substrate of a first conductivity type and having front and rear surfaces;
a plurality of P-N junctions in said semiconductor substrate and being between the front and rear surfaces, said plurality of P-N junctions defining first and second thyristors coupled in anti-parallel;
a control electrode on the front surface of the semiconductor substrate;
a first electrode on the rear surface of the semiconductor substrate;
a second electrode on the front surface of the semiconductor substrate;
a semiconductor column directly coupled to said control electrode and extending between said control electrode and said first electrode and coupled to at least one P-N junction from said plurality of P-N junctions, said semiconductor column having a same conductivity type throughout;
said control electrode configured to control a current flow between said first and second electrodes; and
a semiconductor wall in the semiconductor substrate and surrounding said semiconductor column, said semiconductor wall being of a second conductivity type different from the first conductivity type.

7. The apparatus of claim 6 wherein the first electrode, second electrode, and the control electrode in combination form at least part of a switch.

8. The apparatus of claim 7 wherein the switch is a vertical switch.

9. The apparatus of claim 8 wherein the switch is a vertical bidirectional switch.

10. The apparatus of claim 7 wherein the switch is configured to be controllable in response to a positive voltage between the gate electrode and the first electrode.

11. The apparatus of claim 6 wherein the semiconductor substrate comprises at least one region doped to impede current flow between the first electrode and the second electrode.

12. The apparatus of claim 11 wherein the at least one region is configured to limit current flow to a pinched region between the first electrode and the second electrode.

13. The apparatus of claim 6 further comprising an insulating layer configured to contact the semiconductor column opposite the gate electrode.

14. A method for making an apparatus comprising:
forming a semiconductor substrate of a first conductivity type and having front and rear surfaces;
forming a plurality of P-N junctions in the semiconductor substrate and being between the front and rear surfaces, the plurality of P-N junctions defining first and second thyristors coupled in anti-parallel;
forming a control electrode on the front surface of the semiconductor substrate;
forming a first electrode on the rear surface of the semiconductor substrate;
forming a second electrode on the front surface of the semiconductor substrate;
forming a semiconductor column directly coupled to the control electrode and extending between the control electrode and the first electrode and coupled to at least one P-N junction from the plurality of P-N junctions, the semiconductor column having a same conductivity type throughout, the control electrode configured to control a current flow between the first and second electrodes; and
forming a semiconductor wall in the semiconductor substrate and surrounding the semiconductor column, the semiconductor wall being of a second conductivity type different from the first conductivity type.

15. The method of claim 14 wherein the first electrode, the second electrode, and the control electrode in combination form at least part of a switch.

16. The method of claim 15 wherein the switch is a vertical switch.

17. The method of claim 16 wherein the switch is a vertical bidirectional switch.

18. The method of claim 15 wherein the switch is configured to be controllable in response to a positive voltage between the gate electrode and the first electrode.

19. The method of claim 14 wherein the semiconductor substrate comprises at least one region doped to impede current flow between the first electrode and the second electrode.

20. The method of claim 19 wherein the at least one region is configured to limit current flow to a pinched region between the first electrode and the second electrode.

21. The method of claim 14 further comprising forming an insulating layer configured to contact the semiconductor column opposite the gate electrode.

* * * * *